United States Patent [19]

Plester

[11] Patent Number: 5,849,366
[45] Date of Patent: Dec. 15, 1998

[54] HOLLOW CONTAINERS WITH INERT OR IMPERMEABLE INNER SURFACE THROUGH PLASMA-ASSISTED SURFACE REACTION OR ON-SURFACE POLYMERIZATION

[75] Inventor: George Plester, Brussels, Belgium

[73] Assignee: The Coca-Cola Company, Atlanta, Ga.

[21] Appl. No.: 616,778

[22] Filed: Mar. 19, 1996

Related U.S. Application Data

[63] Continuation of Ser. No. 197,258, Feb. 16, 1994, abandoned.

[51] Int. Cl.$^6$ ................................ B05D 3/00; C08J 7/18; H05H 1/00
[52] U.S. Cl. .......................... 427/491; 427/489; 427/490; 427/536; 427/539
[58] Field of Search ................................... 427/488, 489, 427/490, 491, 536, 537, 539, 551, 553, 554, 557, 558, 236, 237, 238, 579

[56] References Cited

U.S. PATENT DOCUMENTS

| | | | |
|---|---|---|---|
| 2,810,933 | 10/1957 | Pierce et al. | 427/536 |
| 2,892,733 | 6/1959 | Gardner et al. | 427/237 |
| 3,262,808 | 7/1966 | Crooks et al. | 427/536 |
| 3,309,299 | 3/1967 | Mantell | 427/536 |
| 3,361,587 | 1/1968 | Menikeim et al. | 427/536 |
| 3,829,324 | 8/1974 | Blais et al. | 427/491 |
| 4,096,315 | 6/1978 | Kubacki | 427/491 |
| 4,137,365 | 1/1979 | Wydeven et al. | 427/491 |
| 4,145,458 | 3/1979 | Koenings et al. | 427/579 |
| 4,262,035 | 4/1981 | Jaeger et al. | 427/579 |
| 4,374,157 | 2/1983 | Barbier et al. | 427/237 |
| 4,396,641 | 8/1983 | Imada et al. | 427/489 |
| 4,401,054 | 8/1983 | Matsuo et al. | 118/723 |
| 4,438,152 | 3/1984 | Barbier et al. | 427/237 |
| 4,465,715 | 8/1984 | Manabe et al. | 427/536 |
| 4,468,412 | 8/1984 | Fujii et al. | 427/536 |
| 4,478,874 | 10/1984 | Hahn | 427/40 |
| 4,569,738 | 2/1986 | Kieser et al. | 427/38 |
| 4,585,668 | 4/1986 | Asmussen et al. | 427/38 |
| 4,599,135 | 7/1986 | Tsunekawa et al. | 118/50.1 |
| 4,667,620 | 5/1987 | White | 118/50.1 |

(List continued on next page.)

FOREIGN PATENT DOCUMENTS

| | | |
|---|---|---|
| 3632748 A1 | 4/1988 | Germany . |
| 3908418 A1 | 9/1990 | Germany . |
| 2 053 026 | 2/1981 | United Kingdom . |
| WO 93/24243 | 12/1993 | WIPO . |
| WO 94/27745 | 12/1994 | WIPO . |

*Primary Examiner*—Marianne Padgett
*Attorney, Agent, or Firm*—Birch, Stewart, Kolasch & Birch, LLP

[57] ABSTRACT

Plasma assisted polymerization and deposition of a very thin inner surface coating in a plastic or metal container without an undesirable increase in container surface temperature is provided to change the surface properties of the internal plastic surface of a container by reaction of the surface with a reactive gas which has been energized to produce a plasma or the surface is activated by a plasma of reactive gas so that it becomes receptive to a further surface reaction. It involves locating the container in an enclosure, inserting means for feeding a reactant gas into the container, selectively controlling the pressure inside the enclosure and inside of the container, cleaning a surface of the container to be coated in situ, pretreating the surface to be coated for enabling a polymer coating subsequently deposited thereon to secure proper adhesion between the coating material and the container material, feeding a reactant gas of predetermined constituency and having barrier properties into the container, generating a plasma of said reactant gas and depositing a relatively thin polymer coating on the surface to be coated, and performing a post polymerization treatment on said polymer coating for eliminating residual monomers and other polymer extractables in situ following deposition of said polymer coating.

15 Claims, 5 Drawing Sheets

U.S. PATENT DOCUMENTS

| | | | |
|---|---|---|---|
| 4,692,347 | 9/1987 | Yasuda | 427/491 |
| 4,698,234 | 10/1987 | Ovshinsky et al. | 427/253 |
| 4,715,937 | 12/1987 | Moslehi et al. | 427/38 |
| 4,735,832 | 4/1988 | Ichikawa et al. | 427/489 |
| 4,737,379 | 4/1988 | Hudgens et al. | 427/579 |
| 4,746,538 | 5/1988 | Mackowski | 427/237 |
| 4,752,426 | 6/1988 | Cho | 427/38 |
| 4,756,964 | 7/1988 | Kincaid et al. | 427/40 |
| 4,888,199 | 12/1989 | Felts et al. | 427/10 |
| 4,894,256 | 1/1990 | Gärtner et al. | 427/237 |
| 4,902,529 | 2/1990 | Rebhan et al. | 427/237 |
| 5,041,303 | 8/1991 | Wertheimer et al. | 427/39 |
| 5,051,308 | 9/1991 | Reed et al. | 427/489 |
| 5,298,587 | 3/1994 | Hu et al. | 427/489 |
| 5,308,649 | 5/1994 | Babacz | 427/237 |
| 5,314,724 | 5/1994 | Tsukune et al. | 427/489 |
| 5,326,584 | 7/1994 | Kamel et al. | 427/491 |
| 5,370,937 | 12/1994 | Lee et al. | 428/448 |
| 5,378,510 | 1/1995 | Thomas et al. | 427/563 |
| 5,447,799 | 9/1995 | Loh et al. | 427/489 |
| 5,487,920 | 1/1996 | Lopata et al. | 427/536 |
| 5,521,351 | 5/1996 | Mahoney | 427/490 |
| 5,569,497 | 10/1996 | Verzaro et al. | 427/491 |
| 5,677,010 | 10/1997 | Esser et al. | 427/491 |
| 5,679,412 | 10/1997 | Kuehnle et al. | 427/536 |

HOLLOW CONTAINERS WITH INERT OR IMPERMEABLE INNER SURFACE THROUGH PLASMA-ASSISTED SURFACE REACTION OR ON-SURFACE POLYMERIZATION

This application is a continuation, of application Ser. No. 08/197,258 filed on Feb. 16, 1994, now abandoned.

BACKGROUND OF THE INVENTION

This invention relates generally to hollow containers with inert and/or impermeable surfaces and more particularly to hollow plastic containers with inert/impermeable inner surfaces produced by plasma assisted in situ polymerization or surface activation.

Plastic and metal containers have been replacing glass in many applications where easy handling, low weight and non-breakability are needed. Where metal is used, the internal metal surface of the container must often be coated with a polymer to avoid contact of the packaged content with the metal. Therefore, in the case of plastic packages, and also in case of many metal containers, the contact surface with the packaged content typically comprises a polymer.

Polymers to date have had varying degrees of inertness to the packaged content which differ from the inertness of glass. In the case of food packages, surface inertness helps diminish potential desorption of packaging material components into the food, to prevent flavor-absorption, to avoid loss of food constituents through the package walls and to avoid ingress of air or other substances from outside the package. All these characteristics of inertness apply to plastic containers; however, some of these characteristics also apply to metal containers which have been internally coated with a plastic or lacquer system.

Refillable plastic packages add a further dimension to inertness requirements because these packages must withstand washing and refilling. Such containers should not absorb contact materials such as washing agents or foreign materials stored in the container.

Packages for carbonated beverages are also normally pressurized and must withstand considerable mechanical stress in handling. It is therefore difficult for a single material to provide the necessary mechanical stability and the required inertness.

Current plastic packages for carbonated beverages either consist of a single material such as polyethylene terephthalate (PET), or are comprised of multi-layer structures where usually the middle layers provide the barrier properties and the outer layers the mechanical strength properties. Such containers are produced either by co-injection or co-extrusion. To date, plastic containers with an impermeable, dense "glass-like" inner surface have not been able to be produced by conventional methods.

Some polymers, e.g. polyacrylonitrile, are known to have exceptional barrier properties, but can only be used in copolymer form because the homopolymer, which has the most ideal barrier properties, cannot be processed in the form of a container. A further limitation in the practical application of polymers for food or beverage containers is that polymers with high barrier properties, again as exemplified by acrylonitrile, tend to have aggressive/dangerous monomers, which implies that their use is limited for food contact unless full polymerization without detectable extractables can be achieved.

Recycling is yet another dimension with mass produced packages. The reuse of recycled plastic for the same purpose, i.e. to produce new containers by "closed loop" recycling, is an issue which has attracted much attention, and for PET, this has been achieved to date by depolymerizing the recycled material in order to free it of all trace contaminants which might otherwise migrate and come in contact with the container content. An impermeable inner layer, which is the purpose of the invention, would enable recycled material to be reused directly for new containers, i.e. without special treatment such as depolymerization since traces of foreign substances could no longer contact the container's content. This would simplify the "closed loop" recycling process considerably by obviating the need for depolymerization.

Furthermore, recyclability within established recycling systems, both "open loop", i.e. recycling for other uses, or "closed loop", i.e. reuse for same purpose, is necessary for any mass produced package. In "open loop" systems, the normal method is to separate, clean and chop up the plastic into small flakes. The flake is then either melted and used for molding other objects or for fiber production. For this type of recycling, it is important that any contaminant to the main plastic, such as a coating, should effectively be present in negligible quantities and, preferably, be solid and insoluble within the molten plastic so that it can be filtered off prior to sensitive applications, such as fiber production. PET is also recycled in "closed loop" systems by depolymerization and it is important that the coating material should be unchanged by this process, be insoluble in the monomers resulting from the process, and be easily separable from these monomers. An inert, thin organic coating or surface treatment which changes the surface composition of PET, fulfills these criteria.

SUMMARY OF THE INVENTION

Accordingly, it is an object of this invention to provide an inner coating or layer for plastic or metal containers, but particularly for refillable plastic containers used for carbonated beverages having the properties of: glass-like impermeability to polar and non-polar substances; elasticity so as to maintain coating integrity both when container walls flex/stretch under pressure and when walls are indented; adequate durability and adhesion, during working life, when the inner-surface of container is rubbed, or scuffed, or abraded, for example during filling, pouring or normal use; good transparency so as not to affect the appearance of the clear plastic container; resistance against high/low pH in case of refillable containers for carbonated beverages; safe contact with food for contents such as beverages; and, recyclability of container material without adverse effects.

It is another object of this invention to change the surface properties of a plastic container or of a plastic coating, or of a lacquer, either by surface reaction with a gas or by surface activation and later addition of a surface-changing substance such as a metal ion. The purpose of the surface change is to provide a surface with glass-like inertness/impermeability to polar and non-polar substances, which will withstand the normal rigors of the container e.g. flexing, expansion/contraction abrasion, contact with high/low pH, etc. and not affect container transparency/appearance.

It is a further object of this invention to change the surface properties of a plastic container, as already described, so as to provide the main barrier properties and add a very thin coating, also as described, to enable pH resistance, durability and safe contact with food. This two step method enables greater flexibility in establishing ideal barrier materials without the restrictions imposed by a contact surface while the contact coating is too thin to significantly absorb flavors, or foreign materials placed within the container when this is refillable.

The foregoing and other objects of this invention are fulfilled by a method and apparatus to provide for a plasma assisted polymerization and deposition of a very thin inner surface coating in a plastic or metal container and to change the surface properties of the internal plastic surface of a container by reaction of the surface with a reactive gas which has been energized to produce a plasma or the surface is activated by a plasma of reactive gas so that it becomes receptive to a further surface reaction.

The method of forming the polymer coating comprises the steps of: locating the container in an enclosure; inserting means for feeding a reactant gas into the container; selectively controlling the pressure inside the enclosure and inside of the container; cleaning a surface of the container to be coated in situ; pretreating the surface to be coated for enabling a polymer coating subsequently deposited thereon to secure proper adhesion between the coating material and the container material; feeding a reactant gas of predetermined constituency and having barrier properties into the container; generating the plasma of said reactant gas and depositing a relatively thin polymer coating on the surface to be coated; and performing a post polymerization treatment on said polymer coating for eliminating residual monomers and other polymer extractables in situ following deposition of said polymer coating.

In the foregoing process, impermeability to polar and non-polar substances is mainly achieved by: (a) Correct choice of reactive gases or gas mixtures, ionizing (plasma-generating) energy, inert carrier gas mixed with reactive gas(es), vacuum, and gas flow rate, (b) deposition of a dense highly cross-linked polymer substance, in particular, a polymer with high carbon, low hydrogen content. A polymer with a high degree of surface cross linking can be obtained by including hydrocarbons with unsaturated bonds, for example acetylene, ethylene etc., as precursors in the reactive gas mixture; (c) deposition of polymers with inorganic radicals such as radicals of halogens, sulfur, nitrogen, metals or silica to assist resistance to absorption of both polar and non-polar substances. These radicals can be brought into the reaction mixture as inorganic gases e.g. chlorine, fluorine, hydrogen sulfide of chemically bound within an organic molecule e.g. vinylidene dichloride, freons, etc. Silicon and metal radicals can increase absorption resistance to both polar and non-polar substances and can be introduced in gaseous form, for example, as silane (in case of silicon), organic complexes with metals, or volatile metal compounds, in particular hydrides, e.g. $SiH_4$, chlorides, fluorides; (d) Depositions of an even, compact coating over the entire surface and particularly avoiding gas inclusion, porosity, surface imperfections. Mechanical design, for example, the gas distribution pipe, rotation of the container etc. can lead to even distribution of plasma over entire surface and coating conditions, particularly deposition rate, are important parameters; (e) Creation of a high quality plasma by optimum use of energy and avoiding energy loss outside container, for example, avoiding formation of a plasma external to container by maintaining different pressures inside the container and outside it; (f) Creation of free radicals on plastic surface so that this surface can react with the reactive gases introduced in plasma state. In this way, increased polymer cross linking, or the inclusion of inorganic radicals can be achieved on the surface of the substrate polymer itself; (g) Creation of free radicals on plastic surface enabling reaction with liquid inorganic substances provide a dense inorganic surface, chemically bound to the plastic surface; and, (h) Deposition of several thin layers, each with a specific barrier purpose but so thin that they each have negligible absorption.

Resistance to flexing/stretching is mainly achieved by: (a) Treatment of plastic surface to create free radicals, either before, or during the deposition process, so that deposit is chemically bound to surface. This is done by correct choice of surface activating gas plasma in accordance with the substrate characteristics. For example, argon, oxygen, hydrogen and blends thereof can be used for this purpose; (b) Choice of monomer gas(es) giving target polymers which permit flexing; and (c) Very thin coatings enabling flexing without cracking and achieving flexibility by a narrow cross section.

Adhesion is mainly achieved by: (a) Creation of free radicals on the plastic surface, as above, so that deposit is chemically bound to the plastic surface; (b) Causing a reaction of the plastic surface so as to change its actual composition, as opposed to depositing another substance; and (c) Effective surface cleaning during or before main treatment using ionized gas (gas plasma), such as oxygen, to remove surface contaminants.

pH resistance and inertness to contents and transparency are mainly achieved by: (a) Correct choice of substance deposited through choice of reactive gas(es), inert carrier gas(es), ionizing (plasma generating) energy, vacuum, and gas flow rate; and (b) Post treatment with gas plasma to remove unreacted monomers and to saturate unreacted free radicals on the surface.

Apparatus for performing the aforementioned method steps comprise: means for locating the container in the vacuum chamber; means for feeding a reactant gas or a mixture of gases into the container; means for controlling the pressure inside the vacuum chamber; means for controlling the pressure inside of the container; means for cleaning a surface of the container to be coated in situ and pretreating the surface for enabling a polymer coating subsequently deposited thereon to secure proper adhesion between the coating material and the container material; and means for feeding a reactant gas of predetermined constituency and having the capability of reacting to provide high barrier properties in the container for generating a plasma of said reactant gas and depositing a relatively thin polymer coating on the surface to be coated, and thereafter performing a post polymerization treatment on said polymer coating, such as by applying a high-energy source, and for eliminating residual monomers and other polymer extractables in situ following deposition of said polymer coating.

The method of changing the surface composition comprises the steps of: (a) locating a formed container in a vacuum chamber; (b) inserting means for feeding a reactant gas into the container; evacuating the vacuum chamber; (c) feeding a reactant gas or a mixture of gases of a predetermined type into the container; and (d) generating a plasma of said reactant gas for causing a change in the surface composition of the inner surface of said container where the reactant gas is of a type to cause a direct change in surface properties of said plastic inner surface or is of a type to activate the plastic inner surface to enable a reaction of the plastic surface with inorganic materials so as to make the inner plastic surface inert/impermeable.

Apparatus for performing the latter method steps includes: means for locating a formed container in a vacuum chamber; means for feeding a reactant gas into the container; means for evacuating the vacuum chamber; means for feeding a reactant gas of a predetermined type into the container; and means for generating a plasma of said reactant gas for causing a change in the surface composition of the inner surface of said container where the reactant gas is of a type to cause a direct change in surface properties of said plastic inner surface or is of a type to activate the plastic inner surface to enable a reaction of the plastic surface with inorganic materials so as to make the inner plastic surface inert/impermeable.

BRIEF DESCRIPTION OF THE DRAWINGS

The present invention will be more readily understood from the detailed description provided hereinbelow and the accompanying drawings which are provided by way of illustration only, and thus are not limitative of the present invention and wherein.

DETAILED DESCRIPTION OF THE INVENTION

Figure 1:
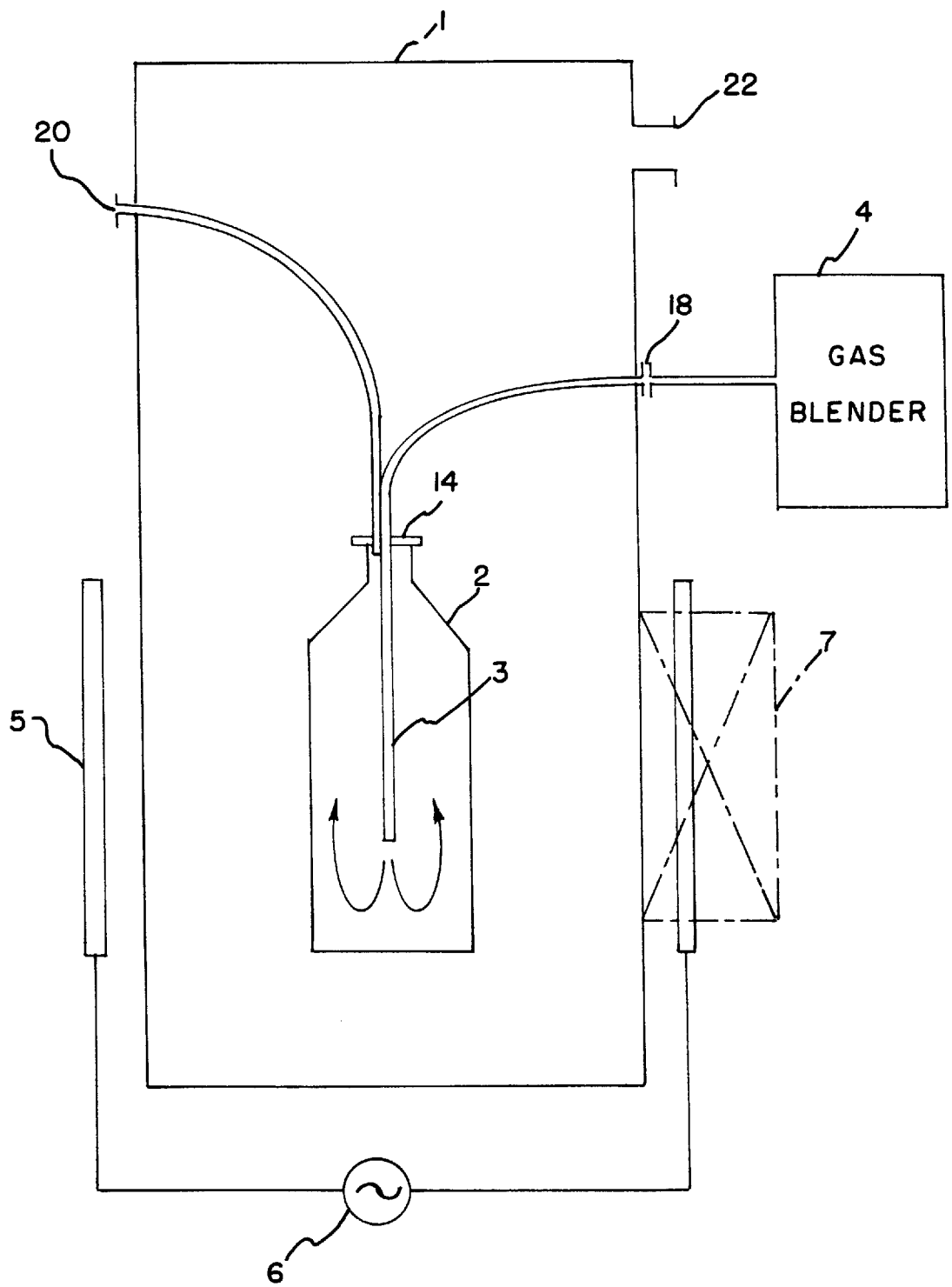
FIG. 1 is an electromechanical schematic diagram broadly illustrative of the invention.

Referring now to the drawings, FIG. 1 is broadly illustrative of the inventive concept of this invention. There a high vacuum enclosure 1 encloses the container 2 to be coated. A metal gas pipe 3 or other type conductor is located in and dips into the base of the container 2 where it ducts gas into the container 2 from a gas blending system 4. The gas flowing into container 2 is a blend of gases energized externally either by a high frequency coil 5 and generator 6 or by a microwave generator 7. One option (not shown) is to connect one terminal of generator 6 to the metal gas pipe 3, thus using it as an electrode and reducing energy losses in plasma generation by having one electrode in direct contact with the plasma.

A further option, not shown, which is particularly applicable for low vacuum operation, is to apply a high DC potential and produce an electrical discharge between metal gas pipe 3 and a grounded terminal outside the container 2, such as the walls of enclosure 1.

In a first method, gas of a predetermined constituency is supplied from the blender 4 which is programmed to first provide a cleansing plasma energized gas stream at the beginning of a coating cycle, before reaction gases are introduced into the system. By the correct selection of the gas blend and by energizing the gas blend to form a plasma, free radicals formed thereby are induced at the inner surface of the container before the reactant gases are introduced. After cleaning and surface activation, where necessary, the cleansing/surface preparation gas blend is switched to a gas blend which provides in situ plasma assisted polymerization. An after treatment of the coating is completed to eliminate monomers and other polymer extractables using the high energy sources of electromagnetic energy 6 or 7 with or without a suitable plasma energized reactant gas from the blender 4.

Plasma assistance secures a clean surface, free of dust and dirt and furthermore enables a wide range of polymerizations, so that the coating polymer can be customized for inertness. Use of very thin coating further enables flexibility and also transparency where the polymer has poor transparency properties. To enable use with heat sensitive plastic containers, the invention also provides for coating without unacceptable increase in substrate surface temperature.

In a second method, the gas blend flowing into container 2 is selected to provide surface reaction(s) and is energized externally either by the high-frequency generator 5, or by the microwave generator 7, or by a high DC potential causing electrical discharge, as described above. Where the surface reaction is intended simply to provide a surface activation preparatory to the subsequent reaction and grafting to plastic surface of gaseous substances, such as inorganic gases, these substances are blended by the blending system 4 and introduced after the surface activation stage already described. Alternatively, where the substances to be added to the activated surface are in liquid form, as for example in case of metal ions, these liquid reactive substances can be introduced at a later stage by a conventional liquid-filling process.

The inside of the container 2 is connected to a controlled vacuum source, not shown, via a cap 14 which also acts to seal the container opening with a tube coupled to a vacuum connector 20. The outside of the container 2 is connected to a second controlled vacuum source, not shown, by means of vacuum connector 22. This enables a vacuum to be applied within the enclosure 1 which is different and independent of the vacuum applied inside container 2 and thus enables proper adjustment of plasma production conditions.

The apparatus described above and shown in FIG. 1 has the capability of providing the following conditions with a view to providing a polymer coating of optimal integrity under stress and with ideal inertness and barrier properties: (1) completeness of coating by pre-cleaning the inner surface of the container using a plasma energized gas; (2) coating adhesion by pretreating the container surface to produce free radical using plasma energized gas, thereby enabling the coating to resist flexing, stretching, indenting, etc.; (3) in situ polymerization of coating which avoids the need to remelt the polymer which in turn limits the range of potential polymers in normal coating applications. Avoiding remelting also avoids depolymerization by-products, and thus potential extractables, therefore improving inertness; (4) in situ free monomer elimination by means of an after treatment, using either an energizing source or a plasma energized reactive gas; (5) separate control of pressure inside and outside container and separate control of gas blend and energizing conditions for each coating phase, so as to provide best conditions for each of the functions alluded to above; (6) very thin coatings, e.g. 25–1500 nm, thereby promoting flexibility, transparency and elimination of extractables; (7) a wide choice of polymerization conditions and a wide range of resulting polymers which are enabled through correct choice of gases, vacuum, and energy input,; and (8) which by correct choice of conditions of vacuum, gas flow and energy input avoids unacceptable heating of the substrate surface, thus enabling use for heat sensitive containers, such as orientated PET.

Also, this apparatus has, with a view to changing the internal surface of a plastic or plastic-coated container, either directly by surface reaction, or by surface activation which enables subsequent surface reaction, the capability of: (1) through correct choice of gases, vacuum and energy input, enabling a wide range of surface reactions; (2) controlling the surface temperature and a surface temperature so that its rise, if any, is limited to that acceptable by heat-sensitive, orientated containers, such as PET; and (3) providing a process which can be used for any plastic and any container, after forming the container, and which is independent of the container-forming machine.

Figures 2A, 2B:
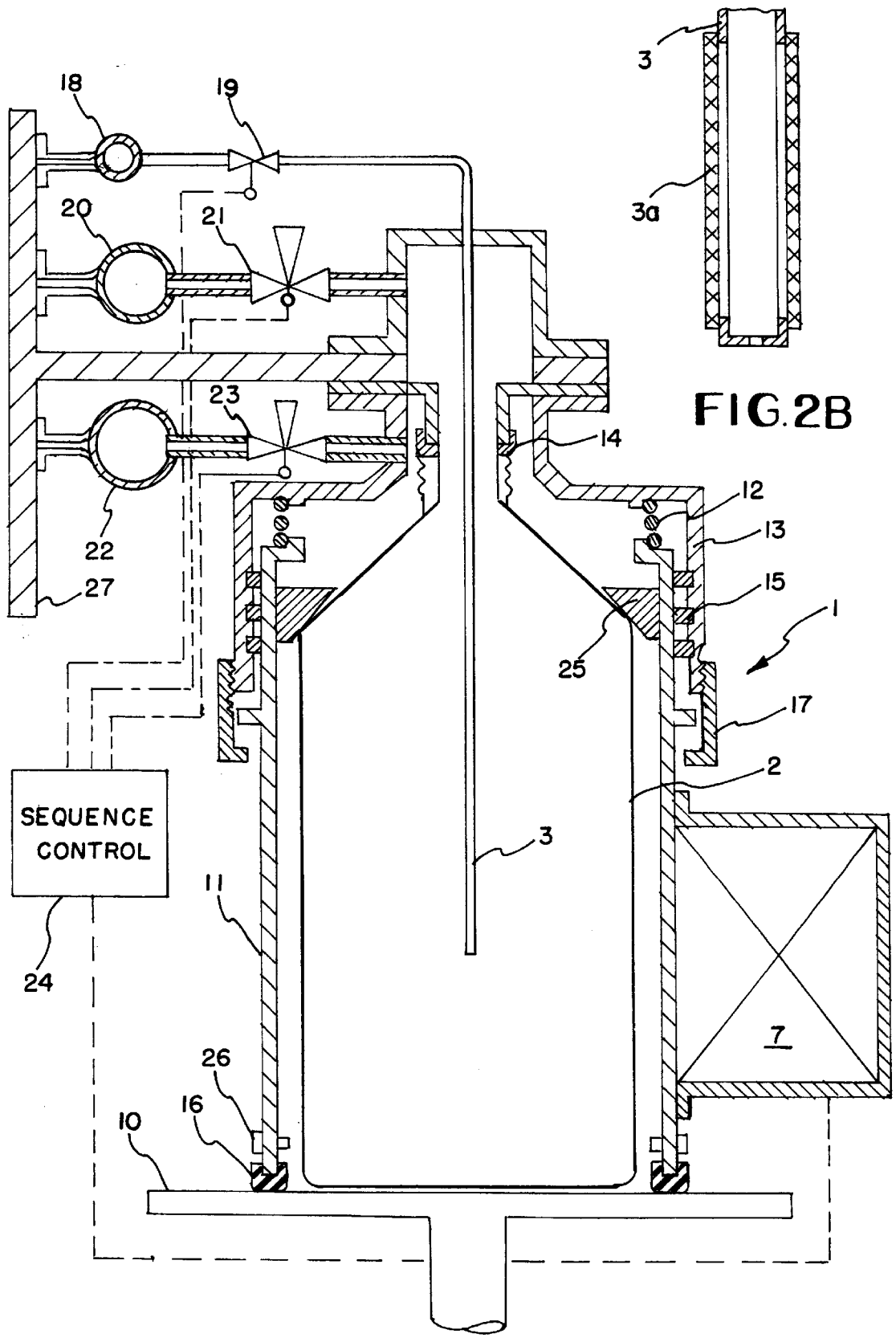
FIG. 2A is a central longitudinal cross sectional view of the preferred embodiment of the invention.
FIG. 2B is a partial cross-sectional view of a modification of the gas tube shown in FIG. 2A.

Referring now to FIG. 2A, shown thereat are further details of the vacuum chamber 1 which additionally comprises: a container elevator 10, a vacuum sleeve 11 which is fitted with spring 12, sliding sealing rings 15, rubber sealing ring 16, and a vacuum sleeve head 13.

Container 2 is adapted to be pushed upwards by the elevator 10 until its progress is stopped by sealing ring 14 which seals the container opening. The container 2 is centered and guided by an annular sliding guide 25. The spring loaded assembly of the vacuum sleeve 11 is secured by cap 17 which also precompresses the spring 12 and connects to the vacuum sleeve head 13. One or more pins 26 ensure that the sliding bottle guide 25 remains in place. The vacuum sleeve head 13 is connected to a bracket 27 supporting the gas tube 3.

In addition, the bracket 27 has a distributor pipe 22 for the vacuum source external to container 2, and a distributor pipe 20 for the vacuum source internal to the container 2. These elements are connected via control valves 23 and 21, respectively. Control valves 23 and 21 enable vacuum to be applied by a sequence controller 24 as soon as the opening of container 2 seals against seal 14, and to release vacuum when container 2 is ready for removal from device. Bracket 27 also has gas distributor 18 which couples from the gas blender 4 to the gas pipe 3 via an on-off valve 19 which is connected to and controlled by sequence controller 24.

Sequence controller 24 in connection with a machine cam, not shown, is mechanically connected to a machine timing apparatus. It also sequences the switching of the plasma generator 6 or 7. The dip tube 3 when desirable can be configured to be fitted with a mantle 3a as shown in FIG. 2B to permit improved distribution of gas to the sides of container 2.

Figure 2C:
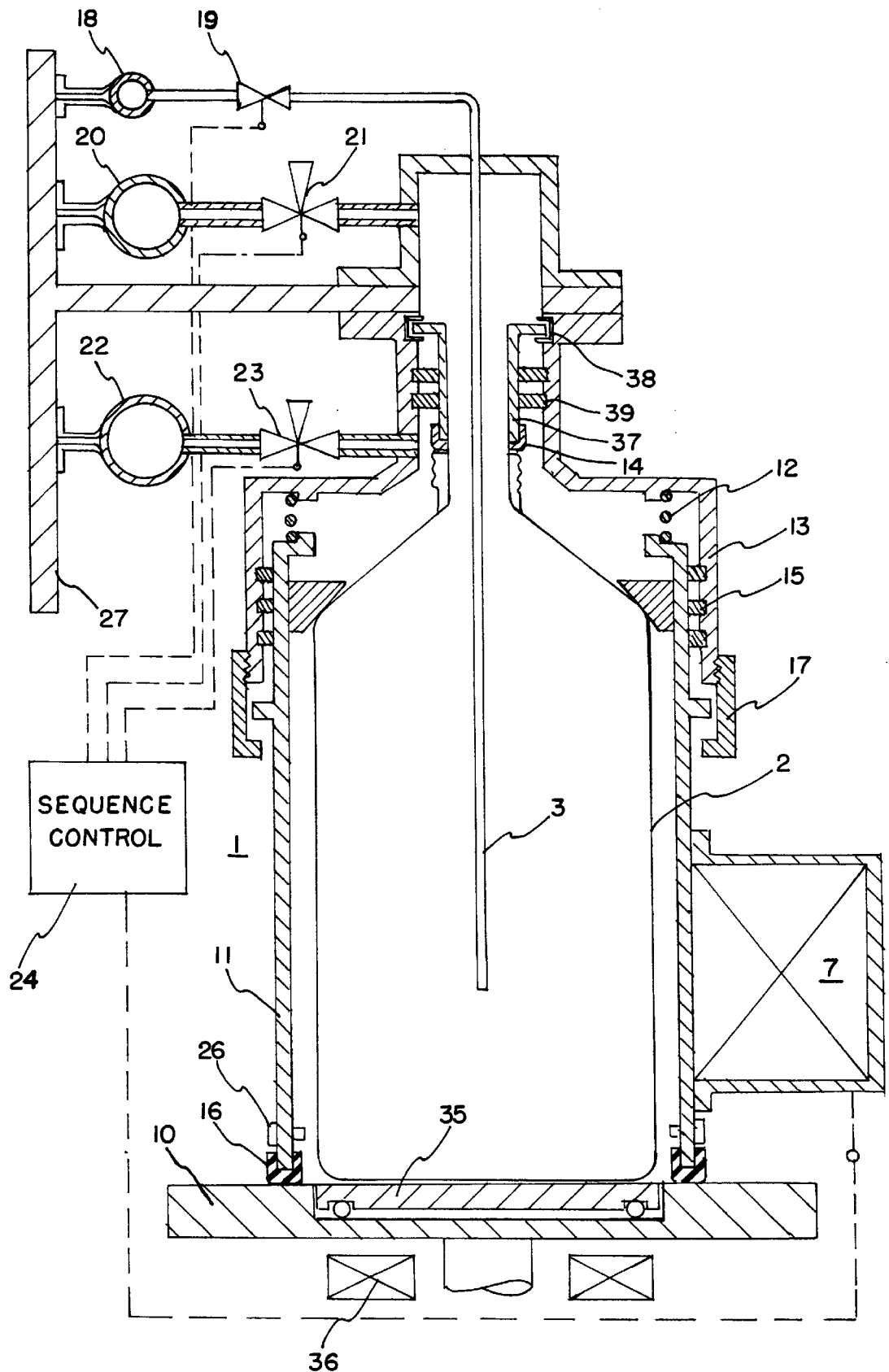
FIG. 2C is a modified version of the embodiment in FIG. 2A which enables the container to be rotated.

FIG. 2C depicts the coating device described by FIG. 2A but now with the additional facility of rotating the container 2. The container 2 rests on a freely-rotating steel platform 35, in which a permanent magnet, not shown, is embedded and which is made to rotate by an external electromagnetic field generated by an electromagnet 36. At the top of container 2, the sealing ring 14 is mounted on a rotatable sleeve 37, which is free to rotate within a recess 38 and a pair of sealing rings 39.

Figure 3:
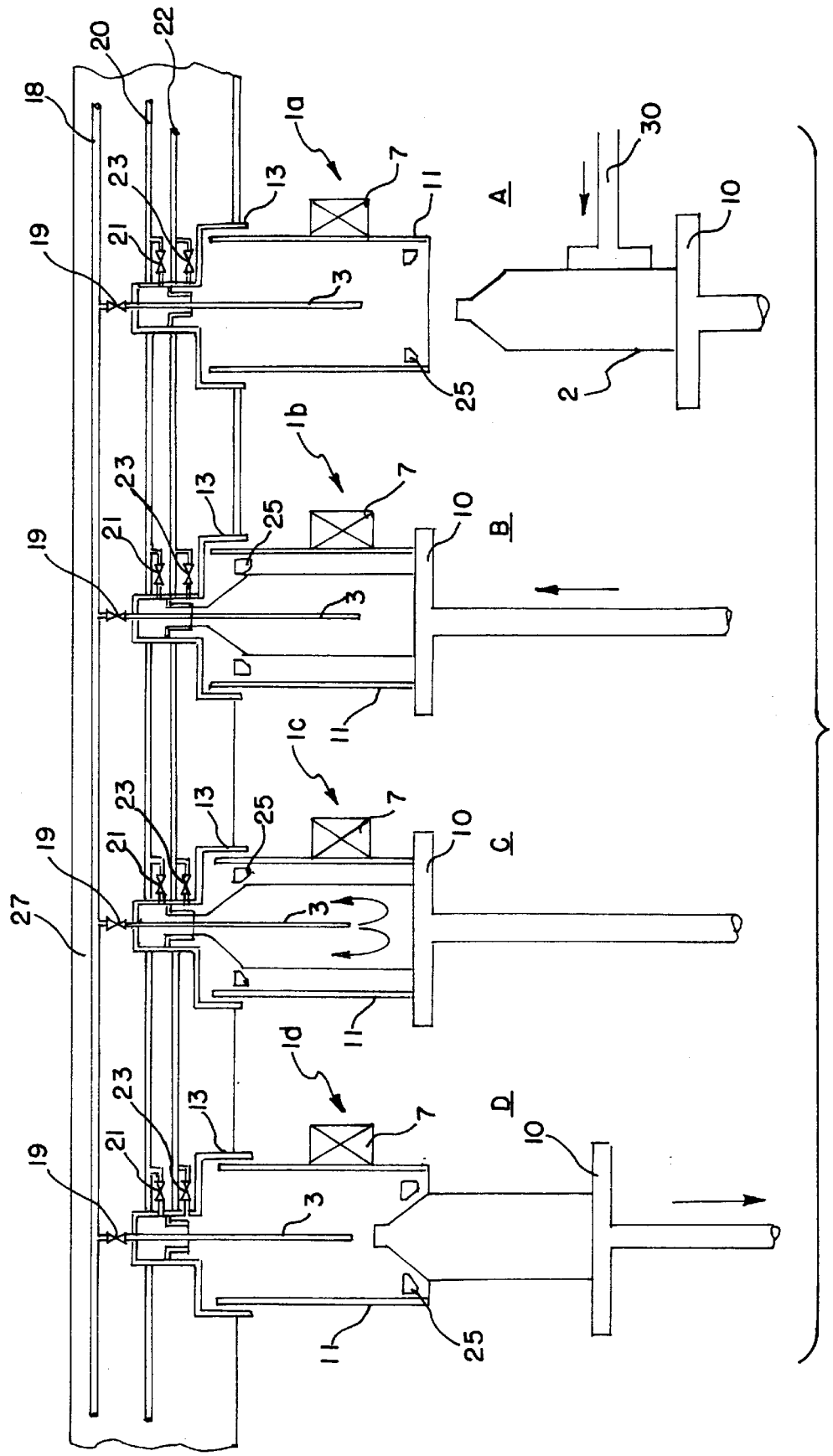
FIG. 3 is a diagram illustrative of a method which is implemented by the apparatus shown in FIGS. 1 and 2.

FIG. 3 depicts one method of operation of the apparatus shown in FIG. 2A. The apparatus shown is a well known "carousel" or rotating type system, and is comprised of at least four coating cells 1a, 1b, 1c and 1d, located at stations A, B, C and D, each including a vacuum sleeve 11 and vacuum sleeve head 13.

At station A, a pusher 30 or other similar device brings container 2 onto an elevator 10 where the container 2 is then pushed up into a chamber formed by the vacuum sleeve 11 and sleeve head 13. At stations B and C, the sequence controller 24 activates the evacuation valves 21 and 23, the gas injection valve 19 and plasma generation means 7 or when desirable, means 6 shown in FIG. 1 in the appropriate order for the coating cycle. At station D, the elevator 10 withdraws and container 2 is ejected. The container handling details, either in a rotating "carousel" type of machine as described, or in lanes, or with other appropriate means, is incidental to the invention and can be implemented as desired.

Figure 4:
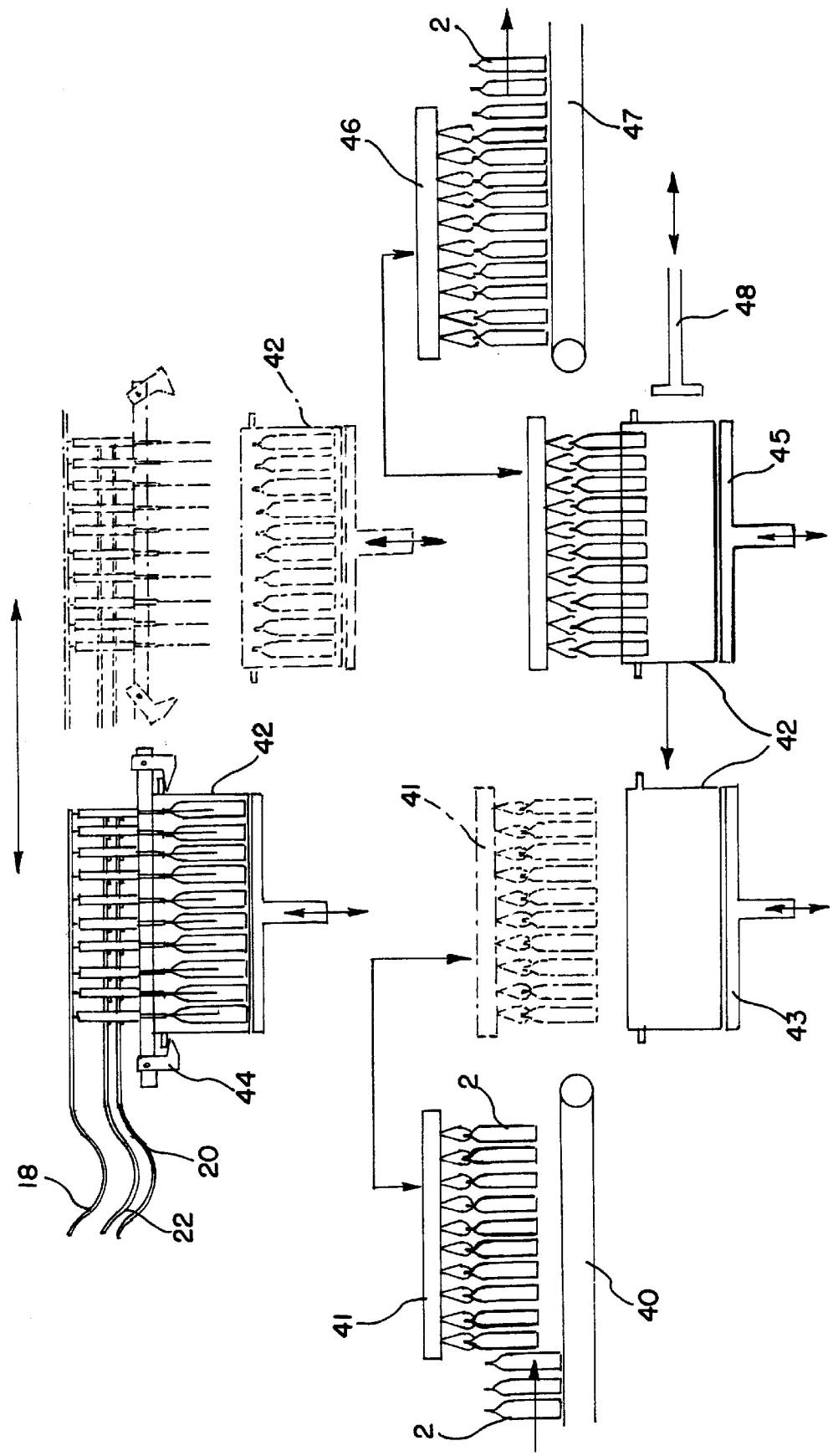
FIG. 4 is a diagram showing another method which can be implemented by the apparatus shown in the Figures.

Since certain coating options for container 2 could involve several layers and coating operations, it may be impracticable to carry them out in the rotating "carousel" type machine, illustrated by FIG. 3. FIG. 4 illustrates a further embodiment where coating times and coating operations of multiple containers can be implemented simultaneously.

As shown, container 2 is transported by conveyor belt 40. A row of containers 2 are then gripped by grippers 41 and placed in treatment vessel 42 where they are firmly located by the shape of the partitions in a treatment vessel 42. In the embodiment shown, a pusher 43 raises the treatment vessel 42 to a treatment head 44 which trips and tightly seals the top of treatment vessel 42. The treatment head 44 includes a multiplicity of all the coating facilities described by FIG. 3, in particular the gas distributor 18, vacuum distribution pipes 20 and 22.

Each individual container 2 in treatment vessel 42 can be rotated by the manner described by FIG. 2A. After coating treatment, the coating head 44 moves to a further position where it releases treatment vessel 42 where it is returned to an unloading position by pusher 45. The containers 2 are then unloaded by grippers 46 onto a finished goods conveyor belt 47. The empty treatment vessel 42 is now returned by pusher 48 to receive fresh load of container 2 from gripper 41.

There is a plurality of treatment vessels 42 and treatment head(s) 44 according to production needs, and the cycle can operate either by raising the treatment vessels 42 to the treatment head(s) 44, as shown, or by conveying the treatment vessel 42 horizontally to one or several treatment positions and lowering one or several treatment heads 44 to the treatment vessel 42.

The container or treatment vessel handling details, be it in a "carousel" type drive as shown in FIG. 3, or in a linear device as shown in FIG. 4, are state-of-the-art and accordingly are incidental to this invention. The invention intends only to demonstrate the principles as illustrated by FIG. 3 and FIG. 4. These are essential to enable containers to be processed by practical means at high speed, while giving the flexibility of coating parameters required to produce the high quality coating criteria described.

Having thus shown and described what is at present considered to be the preferred embodiment of the invention, it should be noted that all modifications, alterations and changes coming within the spirit and scope of the invention as set forth in the appended claims are herein meant to be included.

I claim:

1. A method of forming a polymer coating on an inner surface of a heat-sensitive, or heat-sensitive, oriented polymer container, comprising:

step (a) which comprises locating said heat-sensitive or heat-sensitive, oriented polymer container in an enclosure;

step (b) which comprises inserting means for feeding reactant gas into the container;

step (c) which comprises controlling a first pressure inside the enclosure and independently controlling a second pressure inside of the container;

step (d) which comprises cleaning in-situ said inner surface of said container to be coated;

step (e) which comprises pre-treating the surface to be coated for enabling the polymer coating to be chemically bonded to the inner surface of said container, said pre-treating prevents cracking or delamination of said polymer coating when walls of said container flex or stretch under pressure, or when said container is subjected to heat or caustic chemicals during washing;

step (f) which comprises feeding a reactant gas mixture into the container which when reacted and when said polymer coating is chemically bonded on said container provides barrier properties including resistance to absorption of liquids or gases beyond the surface of said coating;

step (g) consisting essentially of generating a plasma of said reactant gas, with the exception of silicon containing gas, inside said container that forms a cross-linked, stretchable organic polymer coating having said barrier properties on the surface to be coated, said polymer coating being chemically bonded to the surface to be coated, said polymer coating being present in an amount so as to not contaminate a new container comprising recycled material from said heat-sensitive or heat-sensitive oriented polymer container; and step (h) which comprises performing a post polymerization treatment on said polymer coating for eliminating residual monomers or polymer extractables in-situ following deposition of said polymer coating, wherein transparency, polymer orientation and flexibility of said container of step (a) is maintained by said method of forming said polymer coating on said surface of said container.

2. The method of claim 1, wherein said cleaning step (d) comprises feeding a cleaning gas mixture which provides an electron source when energized in a plasma reaction into said container and generating a cleaning plasma.

3. The method of claim 1, wherein said pretreating step (e) comprises feeding a pretreatment gas mixture which provides an in-plasma electron source and a container surface specific free radical which reacts with said container surface and enhances adhesion to the surface to be coated.

4. The method of claim 1, wherein said step (g) of generating said plasma includes the use of microwave energy, high frequency electromagnetic energy, or a DC discharge.

5. The method of claim 1 wherein said post polymerization treatment step (h) comprises applying electromagnetic energy to said polymer coating by microwave energy, high frequency electromagnetic energy, or DC discharge, with an intensity which induces crosslinking within said polymer and eliminates free-radicals or residual monomers within said polymer coating.

6. The method of claim 1, wherein said post polymerization treatment step (h) comprises feeding a gas mixture into said container and generating a post-polymerization plasma, said gas mixture being chemically inert to said polymer coating and providing an electron source within a plasma, inducing cross-linking and eliminating free-radicals or residual monomers within said polymer coating.

7. The method of claim 1, wherein said depositing step (g) comprises depositing said polymer coating having a thickness ranging between 25 nm and 1500 nm whereby transparency and flexibility are provided.

8. The method of claim 1 wherein said surface to be coated comprises the inside surface of said container.

9. The method of claim 1 wherein said container comprises a plastic container.

10. The method of claim 1, wherein said container is a plastic container having a mouth that is smaller in diameter than the diameter of the walls of the container.

11. The method of claim 10, wherein said container comprises oriented polyethylene terephthalate.

12. The method of claim 1, wherein the polymer coating is present in the range of 25–1500 nm.

13. The method of claim 1, wherein said container is a transparent heat-sensitive container, said polymer coating is 25 nm to 1500 nm in thickness, and said inner surface of said container is inert with respect to contents of the container to be subsequently added.

14. The method of claim 1, wherein during step (g), the plasma is generated on the surface of said container by energy supplied from outside the container.

15. A method of forming a polymer coating on a surface of a heat-sensitive, oriented polymer container, comprising:

step (a) which comprises locating said heat sensitive, oriented polymer container in a vacuum chamber;

step (b) which comprises inserting means for feeding reactant gas into the container;

step (c) which comprises controlling a first pressure inside the vacuum chamber and independently controlling a second pressure inside of the container;

step (d) which comprises cleaning in situ a surface of said container to be coated by feeding a first reactant gas having cleaning properties into said container and generating a first plasma thereof;

step (e) which comprises pre-treating the surface to be coated by feeding a second reactant gas having surface activation properties into said container and generating a second plasma thereof for producing free radicals on the surface to be coated;

step (f) which comprises feeding a third reactant gas into the container which when deposited has barrier properties;

step (g) consisting essentially of generating a third plasma of said third reactant gas, with the exception of silicon containing gas, and forming a cross-linked, stretchable organic polymer coating on the surface to be coated, said polymer coating being chemically bonded to the surface to be coated; said polymer coating being resistant to cracking or delamination when walls of said container flex or stretch under pressure, or when said container is subjected to heat or caustic chemicals during washing, and providing barrier properties including resistance to absorption of liquids or gases beyond the surface of the coating, and being present in an amount so as to not contaminate a new container comprising recycled material from said heat sensitive or heat sensitive oriented polymer container, and step (h) which comprises performing a post polymerization treatment on said polymer coating for eliminating residual monomers or polymer extractables in situ following deposition of said polymer coating by applying electromagnetic energy to said polymer coating from an energy source or feeding a fourth reactant gas into said container and generating a fourth plasma thereof, wherein transparency, polymer orientation and flexibility of said container of step (a) is maintained by said method of forming said polymer coating on said surface of said container.

* * * * *